(12) United States Patent
Huemoeller et al.

(10) Patent No.: US 6,831,371 B1
(45) Date of Patent: Dec. 14, 2004

(54) INTEGRATED CIRCUIT SUBSTRATE HAVING EMBEDDED WIRE CONDUCTORS AND METHOD THEREFOR

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/223,747

(22) Filed: Aug. 19, 2002

Related U.S. Application Data

(60) Provisional application No. 60/365,336, filed on Mar. 16, 2002.

(51) Int. Cl.[7] .............................. H05K 1/11; H01R 12/04
(52) U.S. Cl. ..................... 257/778; 174/261; 174/262; 174/264; 174/260; 361/760; 361/792; 361/794; 257/698; 257/784
(58) Field of Search ................................ 174/261, 253, 174/255, 260, 262, 263, 264, 265, 266, 267; 361/792, 794, 795; 257/698, 778, 784, 734

(56) References Cited

U.S. PATENT DOCUMENTS

| | | | |
|---|---|---|---|
| 4,322,778 A | 3/1982 | Barbour et al. | |
| 4,685,033 A | 8/1987 | Inoue | |
| 4,811,082 A | 3/1989 | Jacobs et al. | |
| 5,021,047 A | 6/1991 | Movern | |
| 5,072,075 A | 12/1991 | Lee et al. | |
| 5,191,174 A | 3/1993 | Chang et al. | |
| 5,229,550 A | 7/1993 | Bindra et al. | |
| 5,239,448 A | 8/1993 | Perkins et al. | |
| 5,404,044 A | 4/1995 | Booth et al. | |
| 5,508,938 A | 4/1996 | Wheeler | |
| 5,774,340 A | 6/1998 | Chang et al. | |
| 5,847,453 A | * 12/1998 | Uematsu et al. | ............ 257/728 |
| 6,081,036 A | 6/2000 | Hirano et al. | |
| 6,175,087 B1 | * 1/2001 | Keesler et al. | ............... 174/261 |
| 6,204,453 B1 | * 3/2001 | Fallon et al. | ............... 174/255 |
| 6,239,485 B1 | 5/2001 | Peters et al. | |
| 6,351,031 B1 | * 2/2002 | Iijima et al. | ................. 257/698 |
| 6,365,975 B1 | 4/2002 | DiStefano et al. | |
| 6,376,906 B1 | * 4/2002 | Asai et al. | ................... 257/698 |
| 6,608,757 B1 | * 8/2003 | Bhatt et al. | ................. 361/748 |

* cited by examiner

*Primary Examiner*—Kamand Cuneo
*Assistant Examiner*—J. B. Patel
(74) *Attorney, Agent, or Firm*—Weiss, Moy & Harris, P.C.

(57) ABSTRACT

An integrated circuit substrate having embedded wire conductors provides high-density interconnect structure for integrated circuits. Wires are shaped to form a conductive pattern and placed atop a dielectric substrate layer. Additional dielectric is electro-deposited over the wires to form an insulating layer that encapsulates the wires. One or more power planes may be embedded within the substrate and wires within the conductive pattern may be laser-welded to vertical wire stubs previously attached to a power plane. Vias may be formed by mechanically or laser drilling (or plasma or chemical etching) through any power planes and screening a copper paste into the drilled holes to form conductive paths through the holes. Via conductors may then be exposed by a plasma operation that removes dielectric, leaving the ends of the via conductors exposed. Wires within the conductive pattern may then be laser-welded to the via conductor ends.

23 Claims, 5 Drawing Sheets

INTEGRATED CIRCUIT SUBSTRATE HAVING EMBEDDED WIRE CONDUCTORS AND METHOD THEREFOR

CROSS-REFERENCE TO:RELATED APPLICATIONS

The present application is related to U.S. Provisional application Ser. No. 60/365,336 filed Mar. 16th, 2002 from which it claims benefit of priority under 35 U.S.C §119(e). The present application is also related to U.S. patent applications: "INTEGRATED CIRCUIT SUBSTRATE HAVING LASER-EMBEDDED CONDUCTIVE PATTERNS AND METHOD THEREFOR", Ser. No. 10,/138,225 filed May 1st, 2002 and "IMPRINTED INTEGRATED CIRCUIT SUBSTRATE AND METHOD FOR IMPRINTING AN INTEGRATED CIRCUIT SUBSTRATE", Ser. No. 09/931,144 filed Aug. 16th, 2001. All of the above-referenced applications were made by the same inventors and assigned to the same assignee. The specifications of the above-referenced patent applications are herein incorporated by reference.

FIELD OF THE INVENTION

The present invention relates generally to semiconductor packaging, and more specifically, to a substrate having embedded wires for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently for lowered inter-conductor spacing, thus setting another practical limit on the interconnect density.

The above-incorporated patent applications "INTEGRATED CIRCUIT SUBSTRATE HAVING LASER-EMBEDDED CONDUCTIVE PATTERNS AND METHOD THEREFOR" and "IMPRINTED INTEGRATED CIRCUIT SUBSTRATE AND METHOD FOR IMPRINTING AN INTEGRATED CIRCUIT SUBSTRATE" describe novel circuit substrates that embed conductive patterns beneath the surface of a printed circuit substrate, thus reducing susceptibility to migration and shorting between the conductors.

However, the techniques described in the above-referenced patent applications use plating and etching processes and otherwise have all of the limitations and disadvantages associated with printed circuit technology.

Therefore, it would be desirable to provide a method and substrate having further increased interconnect density with a low associated manufacturing cost. It would further be desirable to provide a method and substrate that prevents shorting and migration between conductors. It would also be desirable to provide a method and substrate that do not require an etching or plating process.

SUMMARY OF THE INVENTION

A substrate having embedded wires forming conductive patterns within a substrate and a method for manufacturing generate a circuit pattern within a substrate having wires embedded beneath the surface of the substrate. A substantially planar metal layer is covered with a dielectric material and multiple conductive wires are laid in a plane parallel to the metal layer to form the conductive pattern for interconnecting circuits mounted to the substrate and terminals for external connections. The wires and/or the dielectric are heated to secure the wires in position by partial flow of the dielectric material and subsequently covered by another layer of dielectric.

Upwardly-projecting wire stubs may be bonded to the metal layer to provide attachment points for wires, thus providing blind via connections to the metal layer. Holes may be drilled or etched in the metal layer to provide voids for the passage of through vias. The holes are filled with an epoxy and epoxy-filled openings are then laser-ablated, plasma etched or chemically etched to form via paths that are subsequently filled with a conductive material. Upwardly-projecting wire stubs may also be bonded to the conductive material to connect the conductive pattern to the through vias. Multiple layers and double-sided substrates may be provided by adding additional dielectric and conductive wire layers.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
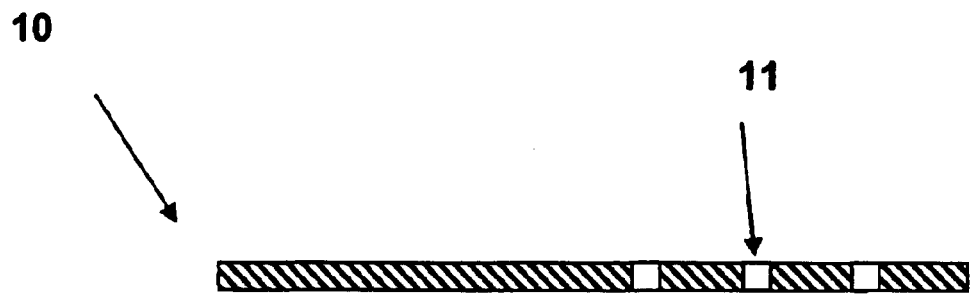
FIG. 1A–1J are pictorial diagrams depicting side views of various stages of preparation of a substrate in accordance with an embodiment of the invention.

Referring now to the figures and in particular to FIG. 1A, a side view of a metal layer 10 for use in preparing a substrate in accordance with an embodiment of the present invention is depicted. Metal layer 10 forms the core of a substrate in a novel process that permits embedding conductive wires within a dielectric layer of a substrate to electrically isolate and mechanically support the wires.

Figure 1B:
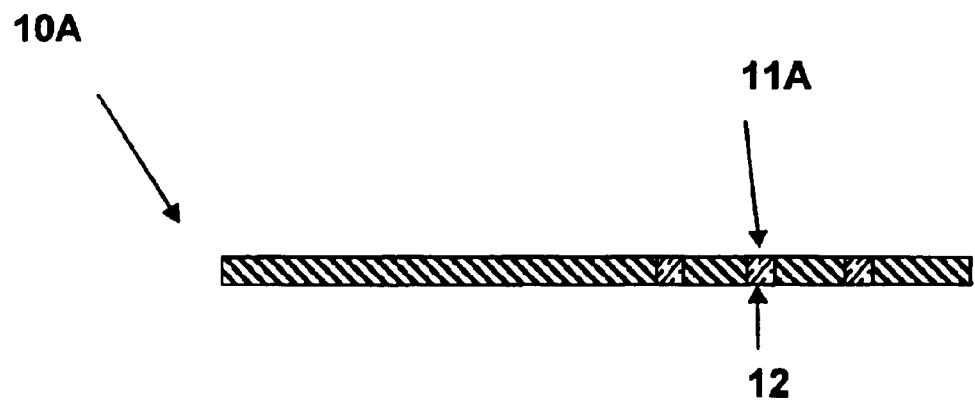
Figure 1C:
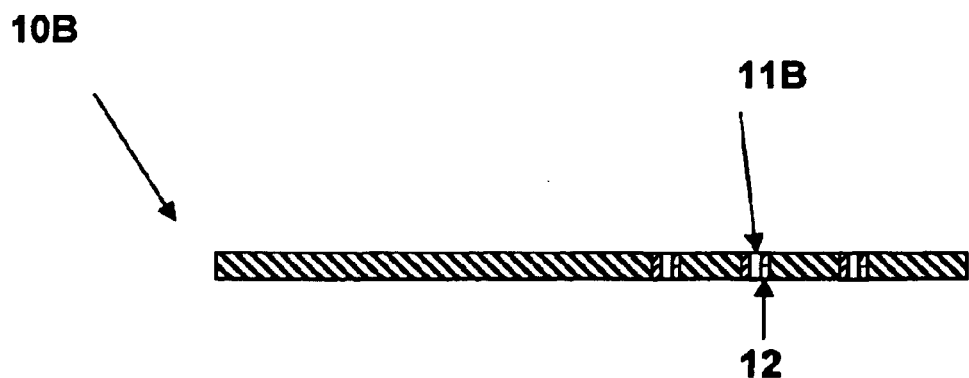
Figure 1D:
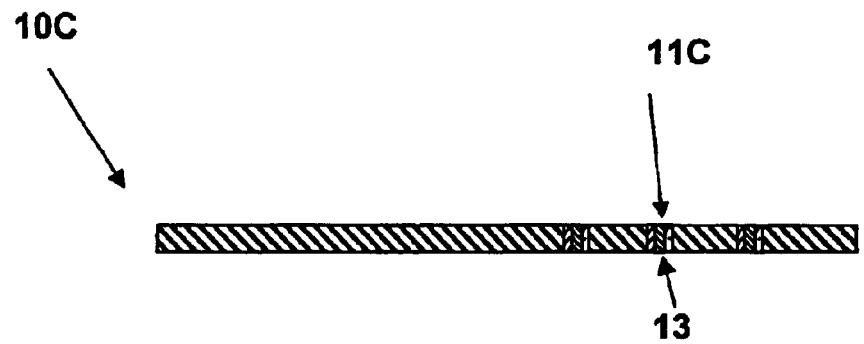
Figure 1E:
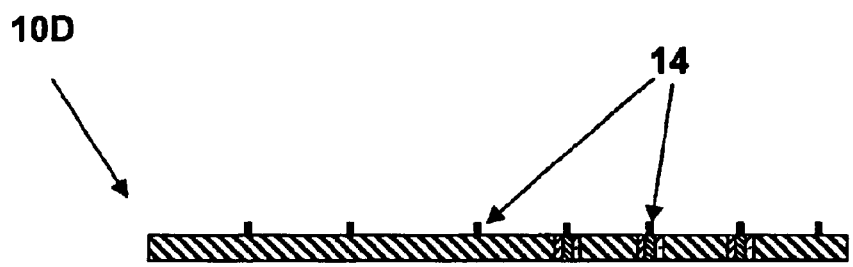
Figure 1F:
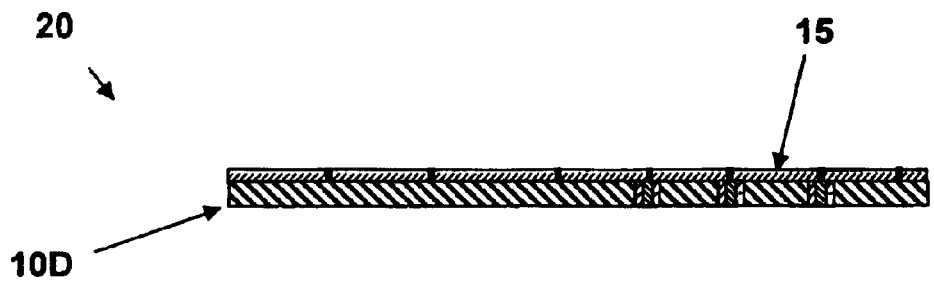
Figure 1G:
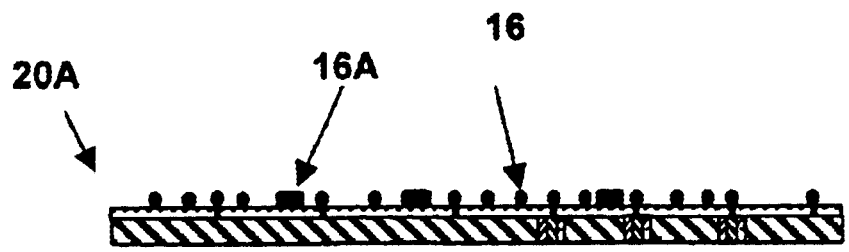

Metal layer 10 is generally a copper film core that may be patterned and etched or die-cut, but other suitable metal layers may be used for form the core of the substrate of the present invention. Voids 11 are generated by drilling or etching metal layer 10, to permit the passage of through vias through metal layer 10. Referring now to FIG. 1B, the voids 11A are insulated from metal layer 10 by applying an epoxy material 12 within voids 11. Then, as depicted in FIG. 1C, epoxy material 12 is laser drilled, chemically etched or plasma etched to provide a through-hole 11B wherein a conductive paste 13 is applied as shown in FIG. 1D. After the through vias have been filled, metal layer is planarized (via a plasma process or other suitable technique) and multiple wire stubs 14 are sintered to metal layer 10C, both directly to the metal and to the conductive paste 13 forming through via conductors. The resulting metal layer assembly 10D is covered with a dielectric layer 15 to form a substrate 20. Dielectric layer 15 can be molded atop metal layer 10C or the dielectric may be electro-deposited (sputtered).

Figure 1H:

Next, a layer of conductive wires 16 forming the circuit pattern is laid on the surface of substrate 20A. Multiple adjacent wires or wire appropriately shaped may be used to provide larger conductors. Attachments to wire stubs 14 are made by laser-welded sintered connections between wires 16 and wire stubs 14. Wires 16 and 16A, dielectric 15 or both are heated to partially flow dielectric 15 material permitting the wires to embed in the surface of dielectric layer 15. The embedding process secures wires 16 until as depicted in FIG. 1H, another layer of dielectric 15A is applied, covering wires 16 and 16A forming a substrate 20B in which wires 16 and 16A are completely embedded. For multiple layer applications, wires 16 can be stamped prior to embedding to provide a landing pad for the addition of wire stubs for connection to another wire layer above. The encapsulating dielectric is generally a pre-preg semi-cured epoxy resin and after the wires have been set in place and covered, a pressure/temperature cure is performed to cure the dielectric material. Alternatively, wires 16 and 16A may be secured with an adhesive, such as an epoxy without performing the heating process described above. The wires are then encapsulated by a resin after the epoxy has cured.

Figure 1I:
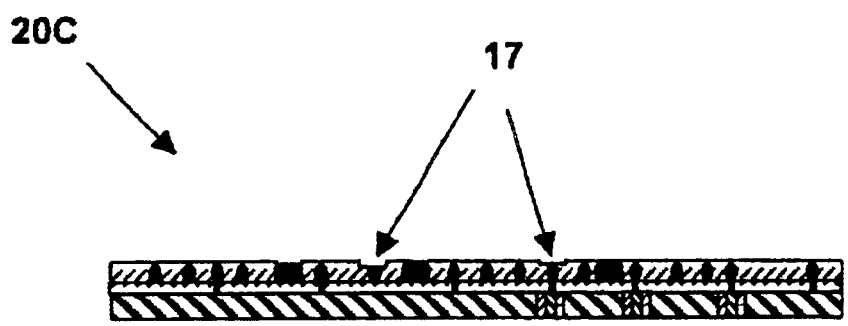
Figure 1J:
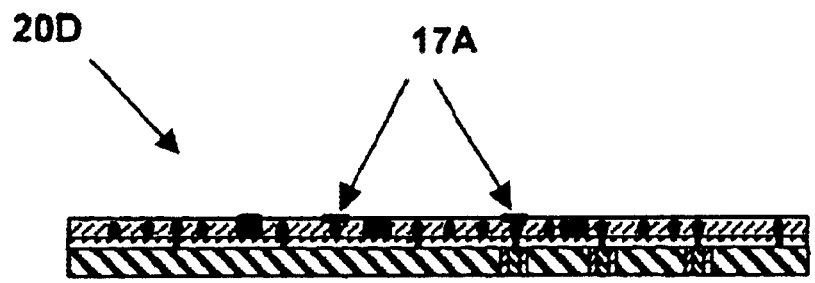

Lands or bond areas are generated on a surface of substrate 20B by ablating dielectric material 15A above wires 16 or 16A to provide wells 17 in substrate 20C, as shown in FIG. 1I. Conductive material is paste-screened within wells 17 to form the lands or bond areas 17A on the top surface of substrate 20D as depicted in FIG. 1J. The conductive paste can be nickel-gold plated if required for wire-bonding or other attachment operations.

Figure 2:
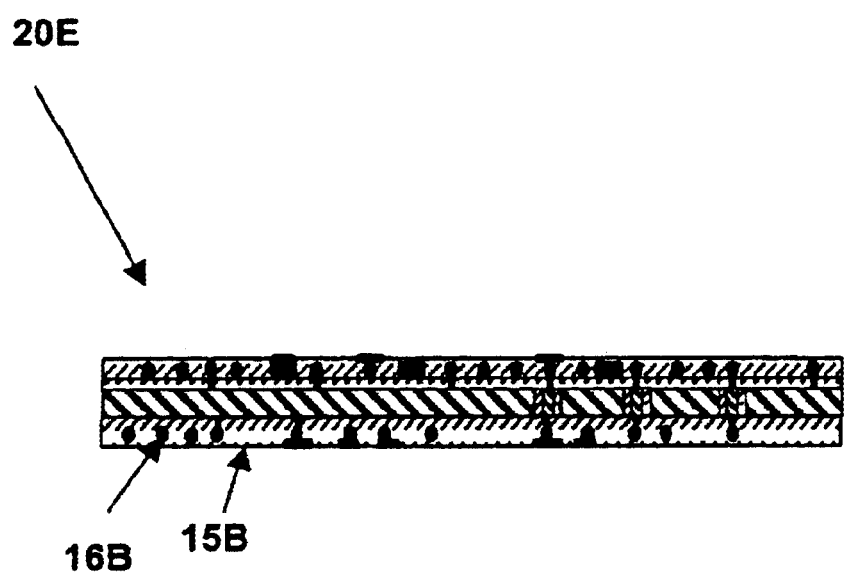
FIG. 2 is a pictorial diagram depicting a side view of a double-sided substrate in accordance with another embodiment of the invention.

Multiple layer circuits may be generated by repeating the steps of applying wires and dielectric in order to stack circuit layers, and a double-sided substrate 20E as depicted in FIG. 2 may be generated by repeating the above steps for the bottom side of substrate 20D. Alternatively, the double-sided preparation of a substrate may be commenced at substrate 20B, prior to laser ablation.

On the bottom side of substrate 20E, lands for solder balls providing external connection terminals are produced in the same manner as lands for die mounting were generated on the top surface of substrate 20D. The metal layer may also be etched from the back side after the top side assembly is complete, providing separated power and ground planes or other conductive patterns prior to adding dielectric material to the bottom side of substrate 20D.

Figure 3A:
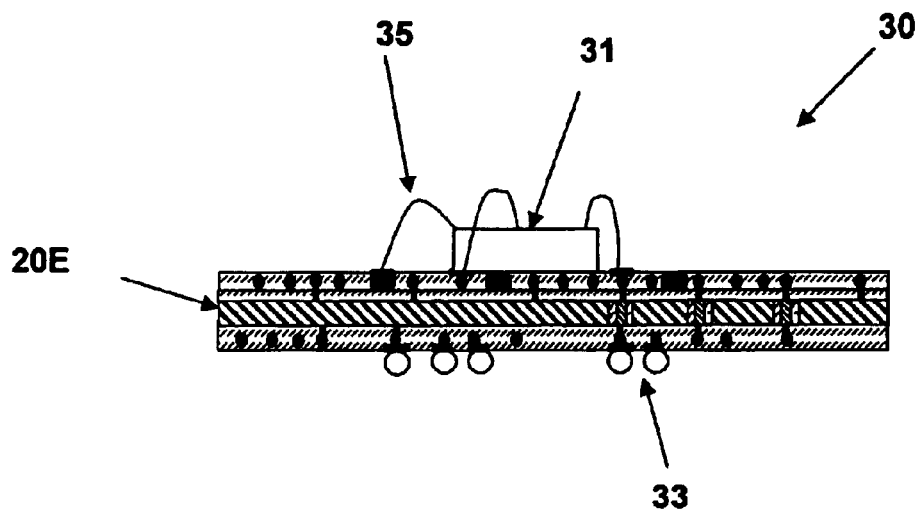
FIG. 3A is a pictorial diagram depicting an integrated circuit in accordance with an embodiment of the invention.

Referring now to FIG. 3A, a cross section view of an integrated circuit 30 in accordance with an embodiment of the invention is depicted. An integrated circuit die 31 is mounted on the top surface of substrate 20E and wires are bonded from bonding pads of substrate 20E to attach points on die 31. Solder balls 33 are attached to the bottom side of substrate at solder lands, providing a BGA (ball grid array) structure for mounting integrated circuit 30 to an external circuit. In general, the wire in the top layer of the multi-layer assemblies or the wire in a single layer assembly should be gold wire or gold-plated wire to provide a surface for bonding.

Figure 3B:
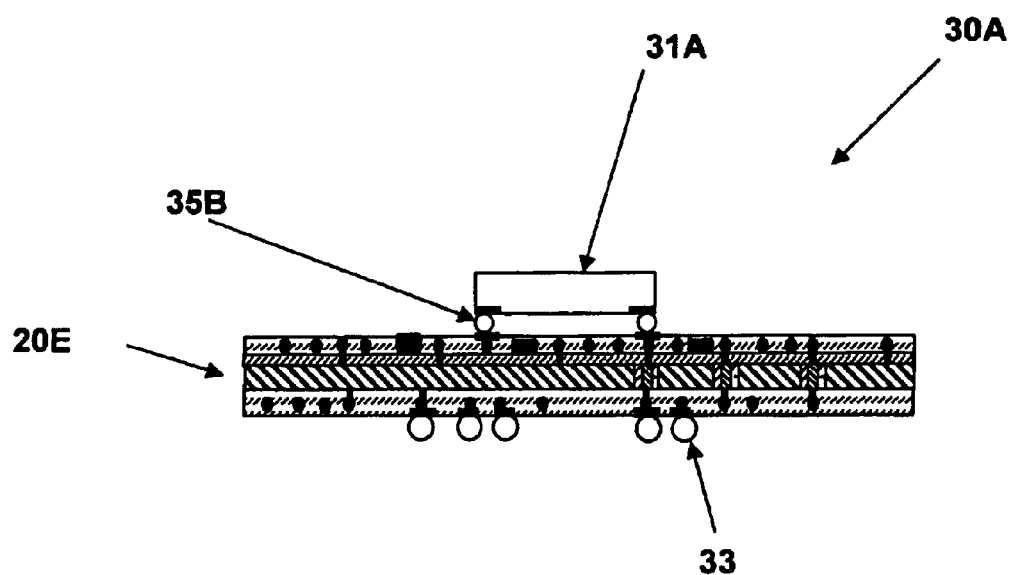
FIG. 3B is a pictorial diagram depicting an integrated circuit in accordance with an alternative embodiment of the invention.

A side view of an alternative integrated circuit 31A assembly in accordance with another embodiment of the present invention is depicted in FIG. 3B. Die 31A is a "flip-chip" die having solder lands on a bottom surface. Solder balls 35A can be pre-attached to either die 31A or substrate 20E and die 31A is subsequently secured to substrate 20E by placing die 31A on substrate and heating the assembly above the solder ball 35A melting point. Solder balls 33 can be attached to the bottom surface of substrate 20E to provide external connections as in integrated circuit 30 of FIG. 3A.

The above description of embodiments of the invention is intended to be illustrative and not limiting. Other embodiments of this invention will be obvious to those skilled in the art in view of the above disclosure and fall within the scope of the present invention.

What is claimed is:

1. A substrate for a semiconductor package comprising:
    a substantially planar metal layer comprising one or more electrically continuous planes for providing power;
    a first dielectric layer disposed on a top surface of the metal layer;
    a plurality of conductive wire segments formed from prefabricated cylindrical wire, wherein the conductive wire segments are encapsulated within the first dielectric layer and disposed substantially parallel to the planar metal layer, for providing electrical connections between contacts located on a top surface of the first dielectric layer; and
    a plurality of conductive wire stubs formed from prefabricated cylindrical wire and having a first end bonded to the metal layer and a second end attached to one of the conductive wire segments for providing electrical connection from the wire segments to the metal layer.

2. The substrate of claim 1, wherein the plurality of wire stubs are wire-bonded to the conductive wire segments.

3. The substrate of claim 1, wherein the metal layer defines voids for passage of through vias, the dielectric layer includes voids in alignment with the voids in the inner metal layer and further comprising a conductive circuit material deposited within the vias for providing connections between the plurality of conductive wire segments to a bottom side of the metal layer.

4. The substrate of claim 1, further comprising:
    a second dielectric layer disposed on a bottom side of the metal layer; and
    a second plurality of conductive conductive wire segments encapsulated within the dielectric layer for providing electrical connections between contacts located on a bottom surface of the dielectric layer.

5. The substrate of claim 4, wherein the metal layer defines voids for passage of through vias, the dielectric layer includes voids in alignment with the voids in the inner metal layer and further comprising a conductive circuit material deposited within the voids for providing connections between the first plurality of conductive wire segments and the second plurality of conductive wire segments.

6. The substrate of claim 5, wherein the voids defined by the metal layer have a diameter greater than the voids in the dielectric layer, and further comprising an insulating material deposited within the voids in the metal layer.

7. The substrate of claim 1, wherein the contacts are wire bonding pads for connection of bond wires for interconnection with an integrated circuit die.

8. The substrate of claim 1, wherein the contacts are bonding pads for direct-connection with terminals of an integrated circuit die.

9. The substrate of claim 1, wherein the contacts are lands for the attachment of solder balls.

10. A semiconductor package, comprising:

A substantially planar metal layer comprising one or more electrically continuous planes for providing power;

a first dielectric layer disposed on a top surface of the metal layer;

a plurality of conductive wire stubs formed from prefabricated cylindrical wire, wherein the conductive wire stubs are encapsulated within the first dielectric layer and extend within the first dielectric layer in a direction perpendicular to the planar metal layer and have a first end bonded to the metal layer for providing electrical interconnection within the integrated circuit to the metal layer;

a die mounted to tho top surface of the dielectric layer and electrically coupled to the conductive wire stubs; and a plurality of electrical terminals mounted to the substrate and electrically coupled to the conductive wire stubs for connecting the die to external circuits, and wherein the substrate further comprises a plurality of conductive wire segments encapsulated within the first dielectric layer in a direction parallel to the plane of the metal layer, for providing electrical connections between the die and the electrical terminals.

11. The semiconductor package of claim 10, wherein the metal layer defines voids for passage of through vias, the dielectric layer includes voids in alignment with the voids in the inner metal layer, and wherein the substrate further comprises a conductive circuit material deposited within the vias for providing connections between the plurality of conductive wire segments to a bottom side of the metal layer.

12. The semiconductor package of claim 10, wherein the substrate further comprises:

a second dielectric layer disposed on a bottom side of the metal layer; and a second plurality of conductive wire segments encapsulated within the dielectric layer for providing electrical connections between contacts located on a bottom surface of the dielectric layer.

13. The semiconductor package of claim 12, wherein the metal layer defines voids for passage of through vias, the dielectric layer includes voids in alignment with the voids in the inner metal layer and wherein the substrate further comprises a conductive circuit material deposited within the voids for providing connections between the first plurality of wires and the second plurality of conductive wire segments.

14. The semiconductor package of claim 13, wherein the voids defined by the metal layer have a diameter greater than the voids in the dielectric layer, and further comprising an insulating material deposited within the voids in the metal layer.

15. The semiconductor package of claim 10, wherein the contacts are wire bonding pads and further comprising a plurality of bond wires bonded between the wire bonding pads and bonding pads of the die.

16. The semiconductor package of claim 10, wherein the contacts are bonding pads for direct connection with terminals of the die, and further comprising a plurality of solder ball connecting terminals on a bottom surface of the die to the bonding pads.

17. A semiconductor package, comprising:

a semiconductor die;

a plurality of electrical terminals for connecting the die to external circuits;

a substantially planar metal layer comprising one or more electrically continuous planes for providing power;

a first dielectric layer disposed an a top surface of the metal layer;

a plurality of conductive wire segments formed from prefabricated cylindrical wire, wherein the conductive wire segments are encapsulated within the first dielectric layer and extend within the first dielectric layer in a direction parallel to the planar metal layer for providing electrical interconnection between the terminal and the semiconductor die; and means for connecting the plurality of conductive wire segments to the metal layer and extending perpendicular to the planar metal layer, thereby providing blind vias to the metal layer.

18. The semiconductor package claim 17, wherein the metal layer defines voids for passage of through vias, the first dielectric layer includes voids in alignment with the voids in the metal layer and further comprising means for providing connections from the conducive wire segments to a bottom side of the metal layer.

19. The semiconductor package of claim 17, further comprising:

a second dielectric layer disposed on a bottom side of the metal layer; and a second plurality of conductive wire segments encapsulated within the second dielectric layer and formed from prefabricated cylindrical wire, and wherein the second plurality of conductive wire segments extend in a direction parallel to a plane of the metal layer for providing electrical connections between contacts located on a bottom surface of the second dielectric layer.

20. The semiconductor package of claim 19, wherein the metal layer defines voids for passage of through vias, the first dielectric layer includes voids in alignment with the voids in the metal layer and further comprising means for providing connections between the first plurality of conductive wire segments and the second plurality of conductive wire segments.

21. The semiconductor package of claim 20, wherein the voids defined by the metal layer have a diameter greater than the voids in the first dielectric layer and further comprising an insulating material deposited within the voids in the metal layer.

22. The semiconductor package of claim 17, further comprising means for connection of bond wires extending from the die to the first plurality of conductive wire segments.

23. The semiconductor package of claim 17, wherein the semiconductor die is a flip-chip die, and further comprising means for connection of terminals of said flip-chip die to the first plurality of conductive wire segments.

* * * * *